United States Patent [19]
Chang et al.

[11] Patent Number: 5,428,838
[45] Date of Patent: Jun. 27, 1995

[54] DIODE MIXER IMPLEMENTED IN A PLANAR MONOLITHIC IC

[75] Inventors: Kwo W. Chang, Rancho Palos Verdes, Calif.; Tzu-Hung Chen, Hsinchu, Taiwan; Louis C. T. Lui, La Habra; Stacey B. T. Bui, Torrance, both of Calif.

[73] Assignee: TRW Inc., Redondo Beach, Calif.

[21] Appl. No.: 91,944

[22] Filed: Jul. 13, 1993

[51] Int. Cl.$^6$ ............................................... H04B 1/26
[52] U.S. Cl. ................................. 455/326; 455/330; 455/333; 333/26
[58] Field of Search ................. 455/323, 325–327, 455/330, 333; 333/25–27, 238, 246

[56] References Cited
U.S. PATENT DOCUMENTS

| | | | |
|---|---|---|---|
| 4,739,519 | 4/1988 | Findley | 455/327 |
| 5,125,111 | 6/1992 | Trinh | 455/327 |
| 5,265,266 | 11/1993 | Trinh | 455/326 |

Primary Examiner—Reinhard J. Eisenzopf
Assistant Examiner—Chi H. Pham

[57] ABSTRACT

A monolithic diode star mixer incorporating an RF balun and a local oscillator balun in which a center microstrip conductor for each of the baluns is configured between parallel strip transmission lines in a common plane. The RF and local oscillator baluns are positioned in a ground plane such that the baluns are at relative right angles to each other and in which the center microstrips are connected. A center ring conductor enables the diodes associated with the mixer to be connected to the transmission lines and a common connection point. Additionally, an intermediate frequency transmission line is also connected to the conductive ring.

21 Claims, 2 Drawing Sheets

DIODE MIXER IMPLEMENTED IN A PLANAR MONOLITHIC IC

BACKGROUND OF THE INVENTION

1. Field of the Invention

This invention relates generally to a diode frequency mixer and, more particularly, to a star diode frequency mixer implemented in a monolithic integrated circuit.

2. Discussion of the Related Art

The properties of electrical components such as amplifiers, filters and detectors typically function at different frequencies. Therefore, it is necessary to shift signals from one component to another, or from one circuit to another, to a frequency where the different components can perform their functions most effectively. Frequency mixers which translate a signal from one frequency to another frequency where the signal can be amplified or processed more effectively are known in the art. It is important that a mixer perform the translation of the frequency with minimal added noise or distortion. A frequency mixer will either add or subtract an input signal to a local oscillator (LO) in order to generate a higher or lower intermediate frequency. A signal which is added to a local oscillator is generally referred to as upconverting, and a signal which is subtracted from a local oscillator is generally referred to as downconverting.

Theoretically, any non-linear or rectifying device can be used as a mixer. Practically, however, particularly at frequencies within the microwave range, Schottky-barrier diodes provide the necessary electrical properties desirable for a frequency mixer. Two general types of diode mixers are known in the art. These types of diode mixers have been referred to as a diode ring mixer and a diode star mixer because of the shape of their electrical configuration. Although the diode ring mixer has traditionally been the most common type of mixer due to its simplicity, the diode star mixer offers a number of advantages not found in the ring mixer. These advantages include low parasitic inductance making possible broad intermediate frequency bandwidths, intermediate frequency DC coupling, and good intermediate frequency isolation. Therefore, diode star mixers are becoming increasingly more popular. For a more detailed discussion of the electrical configuration and operation of diode mixers of these types, see S. A. Mass, Microwave Mixers (2nd edition), Artech House, Norwood, Mass. 1992, herein incorporated by reference.

Diode star mixers of the type discussed above use coupled-line baluns. Baluns of this type generally have poor performance unless the coupled lines have high even-mode impedance and closely matched even and odd-mode phase velocities. In order to provide these features, traditional diode star mixers require that the mixer be configured on a suspended, low dielectric substrate. Therefore, at the present time, diode star mixers have only been implemented in either a multilayered microstrip/stripline or a waveguide environment. Such a configuration has been found impossible for a monolithic circuit, thus limiting the use of these types of mixers. Consequently, the prior art star diode mixer has to be designed as a hybrid circuit that generally requires a labor intensive assembly. This not only increases the cost, but provides a parasitic inductance associated with the hybrid circuit that degrades the performance of the mixer.

What is needed is a diode star mixer incorporating coupled-line baluns which have good balance and good port-to-port isolation, but which can readily be configured in a monolithic circuit. It is therefore an object of the present invention to provide such a diode star mixer.

SUMMARY OF THE INVENTION

This invention discloses a monolithic diode star mixer. The diode star mixer incorporates an RF balun and a local oscillator balun in which a center microstrip conductor for each of the baluns is positioned between parallel strip transmission lines all within a common plane. The RF and local oscillator baluns are configured within a ground plane such that the baluns are at relative right angles to each other and the center microstrips are connected. The transmission lines for each balun are separated at a central location such that each separate transmission line is connected to a transmission line of the other balun. A center ring conductor enables diodes associated with the mixer to be connected to the transmission lines and a common electrical connection point. Additionally, an intermediate frequency transmission line is also connected to the conductive ring.

Additional objects, advantages, and features of the present invention will become apparent from the following description and appended claims taken in conjunction with the accompanying drawings.

DETAILED DESCRIPTION OF THE PREFERRED EMBODIMENTS

The following description of the preferred embodiments concerning a monolithic star diode mixer is merely exemplary in nature and is in no way intended to limit the invention or its application or uses.

Figure 1:
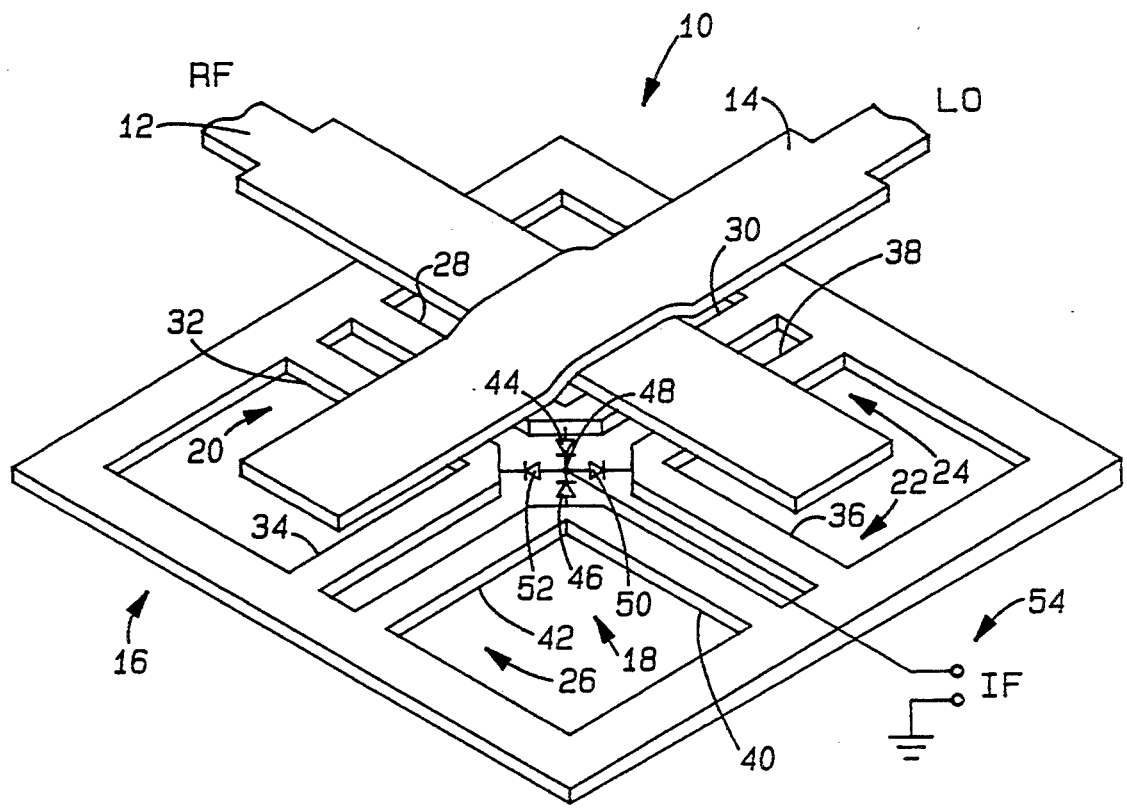
FIG. 1 is a perspective view of a conventional prior art schematic of a diode star mixer.

FIG. 1 shows a prior art perspective view of an integrated star diode mixer 10. The star diode mixer 10 is comprised of an RF metallized microstrip 12 and a local oscillator (LO) metallized microstrip 14 formed at substantially right angles to each other on a top surface of a substrate (not shown). Positioned on a bottom surface of the substrate is a ground plane 16 surrounding a star-shaped configuration of coupled parallel-strip transmission lines 18. The configuration of coupled transmission lines 18 includes four pairs of transmission lines. Specifically, a first pair of coupled transmission lines 20 and a second pair of coupled transmission lines 22 combine with the microstrip 12 to form an RF balun. A third pair of coupled transmission lines 24 and a fourth pair of coupled transmission lines 26 combine with the microstrip 14 to form a local oscillator balun. As is apparent by viewing FIG. 1, a first transmission line 28 associated with the coupled lines 20 is connected to a first transmission line 30 associated with the coupled lines 24, and a second transmission line 32 associated with the coupled lines 20 is connected to a first transmission line 34 associated with the coupled lines 26. Likewise, a first transmission line 36 associated with the coupled lines 22 is connected to a second transmission line 38 associated with the coupled lines 24 and a second transmission line 40 associated with the coupled transmission lines 22 is coupled to a second transmission line 42 of the coupled lines 26 to form the star-shaped configuration.

At a central location relative to the configuration of transmission lines 18 are four diodes. A first diode 44 and a second diode 46 have their cathodes electrically connected to a central connection point 48, as shown. A third diode 50 and a fourth diode 52 have their anodes electrically connected to the connection point 48. The anode of the first diode 44 is connected to the connection point between the transmission lines 28 and 30, the cathode of the third diode 50 is connected to the connection point between the transmission lines 38 and 36, the anode of the second diode 46 is connected to the connection point between the transmission lines 40 and 42, and the cathode of the fourth diode 52 is connected to the connection point between the transmission lines 32 and 34. An intermediate frequency (IF) terminal 54 is taken from the center connection point 48 and ground.

The diode star mixer 10 functions as an up-converter. An intermediate frequency signal applied at the terminal 54 to the connection point 48 will couple with a local oscillator signal on the microstrip 14 to provide an RF output signal on the microstrip 12. The local oscillator signal applied to the microstrip 14 is coupled through the substrate to the coupled transmission lines 24 and 26. This electromagnetic coupling causes a current flow in the coupled transmission lines 24 and 26 in either the same direction or in opposite directions. When the currents on the lines 34 and 42, and 30 and 38 are in the same direction, they behave as a single line such that the gap between these lines does not exist. However, when the currents in these lines are in opposite directions, the coupled lines 24 and 26 behave as if they were parallel-strip transmission lines. By connecting the diodes 44, 46, 50 and 52 in the manner as shown, the diodes 46 and 52 are effectively connected to each other's outer ends, and likewise, the diodes 44 and 50 are also connected at each other's outer ends. Therefore, these pairs of diodes switch on and off each half cycle which alternately connects the signals on the transmission lines such that a mixing results. The operation of star diode mixers are well known in the art. The above described operation of the diode star mixer 10 is merely an overview. For a more complete discussion of the operation of such mixers, see S. A. Mass., Milowave Mixers (2nd Edition) Artech House, Norwood, Mass. 1992, mentioned above.

Figure 2:
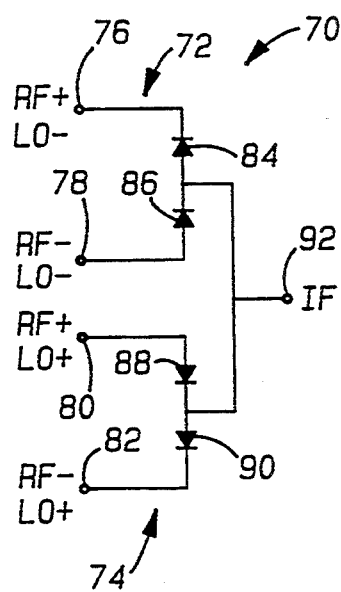
FIG. 2 is a prior art equivalent circuit of a diode star mixer.

FIG. 2 shows an equivalent circuit 70 of a star diode mixer. In particular, the equivalent circuit 70 includes a first balun 72 and a second balun 74. The first balun 72 includes a first terminal 76 for a positive RF signal and a negative local oscillator signal. Additionally, the first balun 72 includes a second terminal 78 for a negative RF signal and a negative local oscillator signal. The second balun 74 includes a first terminal 80 for the positive RF signal and a positive local oscillator signal. Further, the second balun 74 includes a second terminal 82 for the negative RF signal and the positive local oscillator signal.

The first balun 72 includes a first diode 84 and a second diode 86. The second balun 74 includes a first diode 88 and a second diode 90. In the first balun 72, the terminal 76 is connected to the cathode of the diode 84 and the terminal 78 is connected to the anode of the diode 86. In the second balun 74, the terminal 80 is connected to the anode of the diode 88 and the terminal 82 is connected to the cathode of the diode 90. An output from the first balun 72 is taken between the diodes 84 and 86. Likewise, an output of the second balun 74 is taken between the diodes 88 and 90 such that the two outputs from the baluns 72 and 74 are combined at a terminal 92 as an intermediate frequency. Depending on whether a signal is applied at the terminal 92 or an RF signal is applied to the terminals 76, 78, 80 and 82 depends on whether the mixer 70 acts as an up-converter or downconverter. Specifically, if the local oscillator and RF signals are applied to the terminal 76, 78, 80 and 82, then the mixer 70 acts as a downconverter. However, if an intermediate frequency is applied to the terminal 92, then the output at the terminal 76, 78, 80 and 82 are upconverted.

The baluns discussed above with reference to FIG. 1 are coupled-line baluns such that the signals on the microstrips 12 and 14 are coupled through air or a substrate in order to be coupled to the configuration of coupled transmission lines 18. This coupling is required to effect good balance and port-to-port isolation. Therefore, it has heretofore been impossible to configure the baluns in a monolithic manner.

Figure 3:
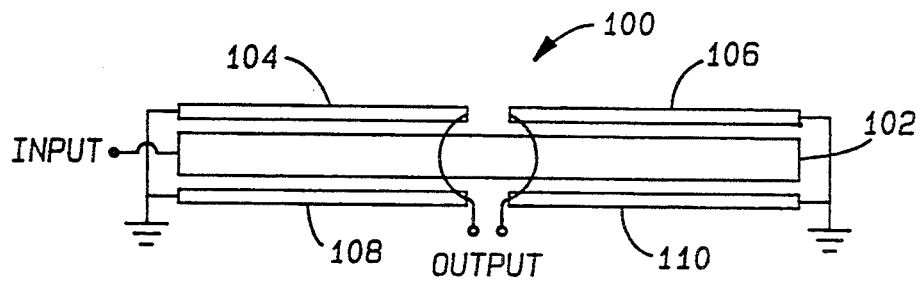
FIG. 3 is a planar balun according to a preferred embodiment of the present invention.

Baluns of the type discussed here are tolerant of low even mode impedances. Because of this tolerance, it has been shown to be possible to provide successful star mixer baluns as planar structures. FIG. 3 shows a balun 100, according to one preferred embodiment of the present invention. In this example, a center microstrip 102 is positioned on a substrate (not shown) and transmission line microstrips 104, 106, 108 and 110 are symmetrically positioned on both sides of the microstrip 102. The microstrip 102 is equivalent to either the RF microstrip 12 or the local oscillator microstrip 14, above. The transmission line microstrips 104 and 108 may be equivalent to transmission lines 28 and 32, and the transmission line microstrips 106 and 110 may be equivalent to the transmission lines 36 and 40, above. Alternately, the transmission line microstrips 104 and 108 may be equivalent to the transmission lines 34 and 42, and the transmission lines 106 and 110 may be equivalent to the transmission lines 30 and 38. The center microstrip 102 acts as an input and the microstrips 104, 106, 108 and 110 are grounded at their outer ends and provide an output at their inner ends.

A balun of this type has advantages over the conventional, non-planar baluns of FIG. 1 when configured on a high-dielectric constant substrate such as alumina or GaAs. In this sort of arrangement, the even and odd-mode phase velocities are better matched. Further, the coupling between the transmission microstrips 104 and 108, or 106 and 110 is much lower than in the conventional star diode mixer, such as mixer 10. Such a design results in better oscillator-to-RF isolation.

Figure 4:
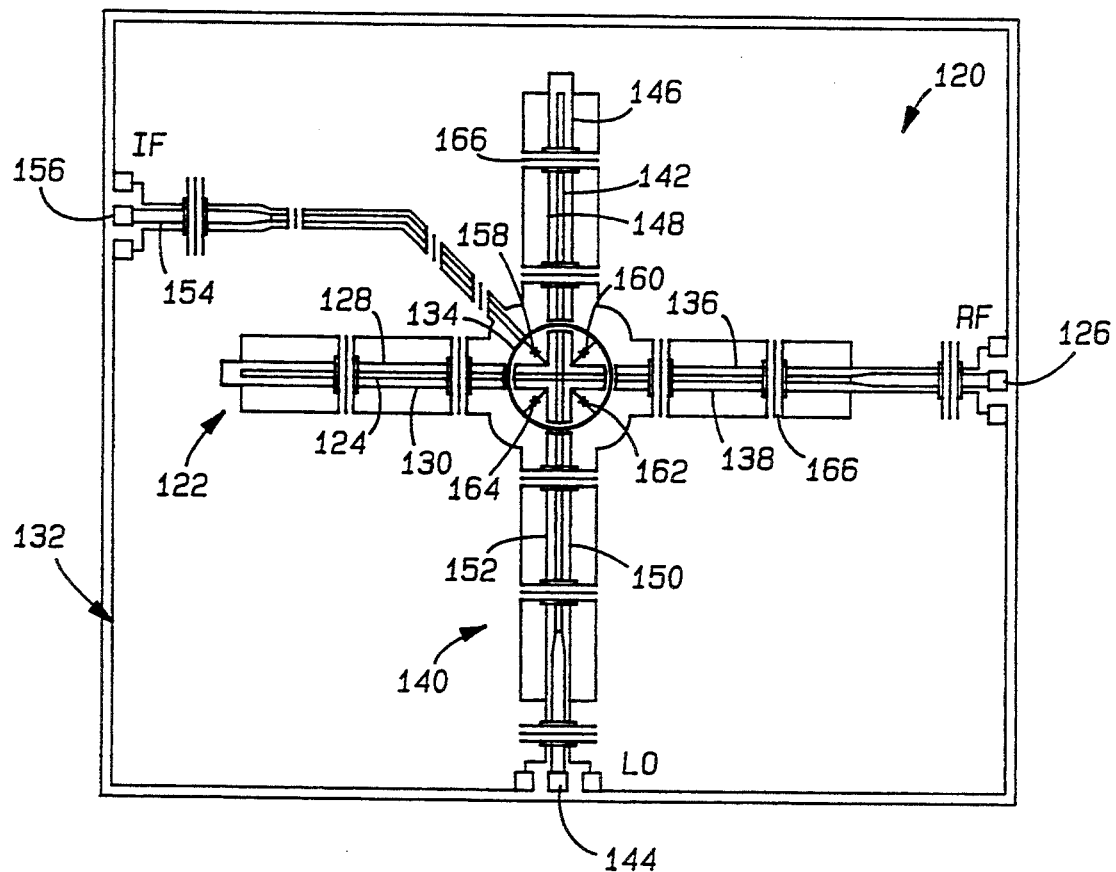
FIG. 4 is a diode star mixer configured on a monolithic integrated circuit according to a preferred embodiment of the present invention.

FIG. 4 shows an incorporation of the type of balun as shown in FIG. 3 into a star diode mixer 120, according to a preferred embodiment of the present invention. An RF balun 122 of the mixer 120 includes a center microstrip 124 which extends from an RF input terminal 126 horizontally across the mixer 120. A first half of the balun 122 includes a first transmission microstrip line 128 and a second transmission microstrip line 130 on opposite sides of the center microstrip line 124. The lines 128 and 130 are electrically connected to a ground plane 132. A second half of the balun 120 includes transmission microstrip lines 136 and 138. The transmission lines 136 and 138 are also connected to the ground plane 132.

A local oscillator balun 140 is also provided extending vertically through the mixer 120. The balun 140 includes a center microstrip 142 which extends from a local oscillator input terminal 144 along the vertical length of the mixer 120. The center microstrip 142 is electrically connected to the RF center microstrip 124 at a central location, as shown. A first half of the local oscillator balun 140 includes a first microstrip transmission line 146 and a second transmission line 148 on opposite sides of the center microstrip 142 connected to the groundplane 132 at an upper location. A second half of the balun 140 includes a third microstrip transmission line 150 and a fourth transmission line 152 on opposite sides of the center microstrip 142 connected to the groundplane 132 at a lower location. Each of the transmission lines 146, 148, 150 and 152 are connected to a center conductive ring 134. Also connected to the center conductive ring 134 is an input line 154 from an intermediate frequency terminal 156.

Because the center microstrips 124 and 142 connect at the central location of the mixer 120, the diodes associated with the star mixer 120 cannot be connected at this common point as above with the mixer 10. This is the reason why the conductive ring 134 is incorporated. In this configuration, a first diode 158 has its cathode electrically connected to the conductive ring 134 and its anode electrically connected to the intersection point between the transmission lines 128 and 148. A second diode 160 has its anode electrically connected to the ring 134 and its cathode electrically connected to the connection point between the transmission lines 146 and 136. A third diode 162 has its cathode electrically connected to the conductive ring 134 and its anode electrically connected to the connection point between the transmission lines 150 and 138. And finally, a fourth diode 164 has its anode electrically connected to the conductive ring 134 and its cathode electrically connected to the connection point between the transmission lines 130 and 152. In this regard, the equivalent electrical connection of the transmission lines, input microstrips and the diodes are the same as that of the prior art diode star mixer 10 above, but the entire system is realized in a single plane for application in a monolithic integrated circuit. A series of air bridges 166 enable the same electric potential points to be connected together.

The configuration of the RF and local oscillator balun discussed above provides a monolithic configuration of a diode star mixer. One particular distinction between the diode star mixer 120 and the prior art diode 'star mixer 10 is that the diodes are not connected to a common point. This arrangement of the star diode mixer 120 may reduce the symmetry of the circuit, and therefore the resulting inductance may limit the intermediate frequency bandwidth. However, a monolithic realization of the diode star mixer 120 will include a conductive ring which is very small, thus reducing these effects. In a particular embodiment, the length of the baluns 122 and 140 were slightly shorter than one-quarter wavelength so that their inductive output impedances compensated for the diode's capacitive reactants. The configuration as shown in FIG. 4 can be implemented in a coplanar waveguide format, or in a microstrip format.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A frequency mixer comprising:
   a first balun, said first balun including a center conductor and first and second transmission lines, said center conductor being positioned between the first and second transmission lines substantially in a common plane as the first and second transmission lines, wherein the first and second transmission lines of the first balun are separated at central location such that a first portion of the first transmission line and a first portion of the second transmission line are substantially equal to a second portion of the first transmission line and a second portion of the second transmission line; and
   a second balun, said second balun including a center conductor and first and second transmission lines, said center conductor of the second balun being positioned between the first and second transmission lines of the second balun substantially within the common plane as the center conductor and the first and second transmission lines of the first balun, the center conductor of the first balun and the center conductor of the second balun being in contact with each other at the central location, wherein the first and second transmission lines of the second balun are separated at the central location such that a first portion of the first transmission line of the second balun and a first portion of the second transmission line of the second balun are substantially equal to a second portion of the first transmission line of the second balun and a second portion of the second transmission line of the second balun, and wherein a signal induced on the first balun is electromagnetically coupled to a signal induced on the second balun to perform a frequency mixing function.

2. The frequency mixer according to claim 1 wherein the first portion of the first transmission line of the first balun is connected to the first portion of the first transmission line of the second balun, the first portion of the second transmission line of the second balun is connected to the second portion of the first transmission line of the first balun, the second portion of the second transmission line of the first balun is connected to the second portion of the second transmission line of the second balun, and the second portion of the first transmission line of the second balun is connected to the first portion of the second transmission line of the first balun.

3. The frequency mixer according to claim 2 further comprising a first diode, a second diode, a third diode, a fourth diode and a common conductor, each of the first, second, third and fourth diodes having one terminal that is electrically connected to the first and second baluns and another terminal that is electrically connected to the common conductor.

4. The frequency mixer according to claim 3 wherein an anode of the first diode is connected to the common conductor and a cathode of the first diode is connected to a connection point between the first portion of the first transmission line of the first balun and the first portion of the first transmission line of the second balun, a cathode of the second diode is connected to the common conductor and the anode of the second diode is connected to a connection point between the second portion of the first transmission line of the first balun and the first portion of the second transmission line of the second balun, an anode of the third diode is connected to the common conductor and the cathode of the third diode is connected to a connection point between the second portion of the second transmission line of the first balun and the second portion of the second transmission line of the second balun, and a cathode of the fourth diode is connected to the common conductor and the anode of the fourth diode is connected to a connection point between the second portion of the first transmission line of the second balun and the first portion of the second transmission line of the first balun.

5. The frequency mixer according to claim 4 wherein an intermediate frequency line is electrically connected to the common conductor in the common plane.

6. The frequency mixer according to claim 1 wherein the center conductor of the first balun is connected to a radio frequency terminal, and the center conductor of the second balun is connected to a local oscillator terminal.

7. The frequency mixer according to claim 1 wherein the first balun and the second balun are configured as part of a monolithic integrated circuit.

8. The frequency mixer according to claim 1 wherein all of the center conductors and transmission lines are metallized microstrips.

9. The frequency mixer according to claim 1 wherein the transmission lines are connected to a common ground plane.

10. The frequency mixer according to claim 1 wherein the first and second baluns are configured on a common semiconductor substrate.

11. A method of fabricating a monolithic frequency mixer comprising the steps of:
providing a first balun, said first balun including a center conductor and first and second transmission lines, said center conductor being positioned between the first and second transmission lines substantially in a common plane as the first and second transmission lines;
providing a second balun, said second balun including a center conductor and first and second transmission lines, said center conductor of the second balun being positioned between the first and second transmission lines of the second balun substantially within the common plane as the center conductor and the first and second transmission lines of the first balun, the center conductor of the first balun and the center conductor of the second balun being connected at a common location; and
providing an intermediate frequency conductor electrically connected to a common conductor, wherein the center conductor of the first balun and the center conductor of the second balun are positioned on the common plane to be electrically separated from the common conductor, and wherein a signal induced on the first balun and a signal induced on the second balun are electromagnetically coupled so as to generate an intermediate frequency on the intermediate frequency conductor.

12. The method according to claim 11 wherein the step of providing a first balun includes separating the first and second transmission lines of the first balun at a central location and separating the first and second transmission lines of the second balun at the central location such that a first portion of the first transmission line of the first balun is connected to a first portion of the first transmission line of the second balun, a first portion of the second transmission line of the second balun is connected to a second portion of the first transmission line of the first balun, a second portion of the second transmission line of the first balun is connected to a second portion of the second transmission line of the second balun, and a second portion of the first transmission line of the second balun is connected to a first portion of the second transmission line of the first balun.

13. The method according to claim 12 further comprising the steps of providing a first diode, a second diode, a third diode, and a fourth diode, wherein one terminal of the first, second, third and fourth diodes is electrically connected to the first and second baluns and another terminal of the first, second, third and fourth diodes is electrically connected to the common conductor.

14. The method according to claim 13 wherein the steps of providing the first, second, third and fourth diodes includes the steps of connecting an anode of the first diode to the common conductor and a cathode of the first diode to a connection point between the first portion of the first transmission line of the first balun and the first portion of the first transmission line of the second balun, connecting a cathode of the second diode to the common conductor and the anode of the second diode to a common connection point between the second portion of the first transmission line of the first balun and the first portion of the second transmission line of the second balun, connecting an anode of the third diode to the common conductor and the cathode of the third diode to a common connection point between the second portion of the second transmission line of the first balun and the second portion of the second transmission line of the second balun, and connecting a cathode of the fourth diode to the common conductor and the anode of the fourth diode to a common connection point between the second portion of the first transmission line of the second balun and the first portion of the second transmission line of the first balun.

15. A method according to claim 11 wherein the step of providing a first and second balun includes connecting the center conductor of the first balun to a radio frequency terminal and connecting the center conductor of the second balun to a local oscillator terminal.

16. A monolithic star diode frequency mixer comprising:
a first balun, said first balun including a center conductor and first and second transmission lines, said center conductor being positioned between the transmission lines substantially in a common plane as the transmission lines, wherein the first and second transmission lines of the first balun are separated at a central location;
a second balun, said second balun including a center conductor and first and second transmission lines, said center conductor of the second balun being positioned between the first and second transmission lines of the second balun substantially within the common plane as the center conductor and transmission lines of the first balun, the center conductor of the first balun and the center conductor of the second balun being connected at a common location, wherein the first and second transmission lines of the second balun are separated at the central location such that a first portion of the first transmission line of the first balun is connected to a first portion of the first transmission line of the second balun, a first portion of the second transmission line of the second balun is connected to a second portion of the first transmission line of the first balun, a second portion of the second transmission line of the first balun is connected to a second portion of the second transmission line of the second balun, and a second portion of the first transmission line of the second balun is connected to a first portion of the second transmission line of the first balun; and a first diode, a second diode, a third diode, a fourth diode and a common conductor, wherein an anode of the first diode is connected to the common conductor and a cathode of the first diode is connected to a connection point between the first portion of the transmission line of the first balun and the first portion of the first transmission line of the second balun, a cathode of the second diode is connected to the common conductor and the anode of the second diode is connected to a connection point between the second portion of the first transmission line of the first balun and the first portion of the second transmission line of the second balun, an anode of the third diode is connected to the common conductor and the cathode of the third diode is connected to a connection point between the second portion of the second transmission line of the first balun and the second portion of the second transmission line of the second balun, and a cathode of the fourth diode is connected to the common conductor and the anode of the fourth diode is connected to a connection point between the second portion of the first transmission line of the second balun and the first portion of the second transmission line of the first balun.

17. The frequency mixer according to claim 16 wherein an intermediate frequency line is electrically connected to the common conductor in the common plane.

18. The frequency mixer according to claim 16 wherein the center conductor of the first balun is connected to a radio frequency terminal and the center conductor of the second balun is connected to a local oscillator terminal.

19. The frequency mixer according to claim 16 wherein all and the center conductors of transmission lines are metallized microstrips.

20. A frequency mixer comprising:
a first balun, said first balun including a center conductor and first and second transmission lines, said center conductor being positioned between the first and second transmission lines substantially in a common plane with the first and second transmission lines;
a second balun, said second balun including a center conductor and first and second transmission lines, said center conductor of the second balun being positioned between the first and second transmission lines of the second balun substantially within the common plane with the center conductor and the first and second transmission lines of the first balun, the center conductor of the first balun and the center conductor of the second balun being in contact with each other at a central location; and
an intermediate frequency conductor being electrically connected to a common conductor, wherein the center conductor of the first balun and the center conductor of the second balun are positioned on the common plane to be electrically separated from the common conductor, and wherein a signal induced on the first balun and a signal induced on the second balun are electromagnetically coupled so as to generate an intermediate frequency on the intermediate frequency conductor.

21. The frequency mixer according to claim 20 further comprising a first diode, a second diode, a third diode and a fourth diode, wherein one terminal of the first, second, third and fourth diodes is electrically connected to the first and second baluns and another terminal of the first, second, third and fourth diodes is electrically connected to the common conductor.

* * * * *

UNITED STATES PATENT AND TRADEMARK OFFICE
CERTIFICATE OF CORRECTION

PATENT NO.   : 5,428,838
DATED        : June 27, 1995
INVENTOR(S)  : Kwo W. Chang; Tzu-Hung Chen; Louis C. T. Liu; Stacey B. T. Bui It is certified that error appears in the above-indentified patent and that said Letters Patent is hereby corrected as shown below:

On the title page, item [75], change "Lui" to --Liu--.

Signed and Sealed this

Second Day of January, 1996

Attest:

BRUCE LEHMAN

*Attesting Officer*  *Commissioner of Patents and Trademarks*